(12) United States Patent
Fujita et al.

(10) Patent No.: US 7,887,899 B2
(45) Date of Patent: Feb. 15, 2011

(54) ANISOTROPIC CONDUCTIVE SHEET, PRODUCTION METHOD THEREOF, CONNECTION METHOD AND INSPECTION METHOD

(75) Inventors: Taro Fujita, Osaka (JP); Yasuhiro Okuda, Osaka (JP); Tsuyoshi Haga, Hyogo (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 284 days.

(21) Appl. No.: 11/918,362

(22) PCT Filed: May 1, 2006

(86) PCT No.: PCT/JP2006/309088

§ 371 (c)(1),
(2), (4) Date: Oct. 12, 2007

(87) PCT Pub. No.: WO2007/023596

PCT Pub. Date: Mar. 1, 2007

(65) Prior Publication Data

US 2009/0269549 A1    Oct. 29, 2009

(30) Foreign Application Priority Data

Aug. 25, 2005    (JP) ............................. 2005-244304

(51) Int. Cl.
*B32B 3/26* (2006.01)
*B32B 3/24* (2006.01)
*B23B 35/00* (2006.01)
*H01R 43/00* (2006.01)
*G01M 19/00* (2006.01)

(52) U.S. Cl. ............... 428/137; 428/131; 428/195.1; 428/209; 428/304.4; 428/318.4; 428/318.6; 428/318.8; 439/91; 257/E23.067

(58) Field of Classification Search ............... None
See application file for complete search history.

(56) References Cited

U.S. PATENT DOCUMENTS 4,435,816 A * 3/1984 Belz et al. .................. 373/91

(Continued)

FOREIGN PATENT DOCUMENTS

GB    2 276 502 A    9/1994

(Continued)

OTHER PUBLICATIONS

Translation of JP 2003-059611 A, Feb. 2003.*

(Continued)

*Primary Examiner*—David R Sample
*Assistant Examiner*—Jeff A. Vonch
(74) *Attorney, Agent, or Firm*—McDermott Will & Emery LLP (57) ABSTRACT

The invention offers an anisotropic electroconductive sheet suitable for connecting with pin electrodes of a through-hole-mounting type. The sheet has electrical conductivity in the direction of thickness. The sheet comprises a base film formed using a porous film (1) that is made of synthetic resin and that has electrically insulating property. The porous film (1) is provided with a plurality of holes (3) that are formed in the direction of thickness so that pin electrodes (2) can be through-hole-mounted. The inner walls of the holes (3) are coated with metals (4). The inserted pin electrodes (2) become electrically continuous, through the metals (4), with the surface opposite to the surface from which the pin electrodes (2) are inserted. It is desirable that a porous film have, at the side from which the electrodes are through-hole-mounted, a nonporous film that is made of synthetic resin and that has electrically insulating property and the nonporous film be provided with a plurality of holes that are formed in the direction of thickness so that the pin electrodes can be through-hole-mounted.

6 Claims, 6 Drawing Sheets

U.S. PATENT DOCUMENTS

| | | | |
|---|---|---|---|
| 4,980,235 A * | 12/1990 | Scheer et al. | 428/421 |
| 6,890,617 B1 * | 5/2005 | Yamaguchi et al. | 428/131 |
| 7,446,545 B2 * | 11/2008 | Matsunaga | 324/754 |
| 7,563,487 B2 * | 7/2009 | Masuda et al. | 427/437 |
| 2004/0171268 A1 | 9/2004 | Yuasa | |
| 2006/0141159 A1 * | 6/2006 | Okuda et al. | 427/331 |
| 2007/0160808 A1 * | 7/2007 | Okuda et al. | 428/137 |

FOREIGN PATENT DOCUMENTS

| | | | |
|---|---|---|---|
| GB | 2276502 A * | 9/1994 | |
| JP | 63-58708 | 3/1988 | |
| JP | 63-259981 | 10/1988 | |
| JP | 03-039854 U | 4/1991 | |
| JP | 3-91669 | 9/1991 | |
| JP | 5-226022 | 9/1993 | |
| JP | 1993226022 A * | 9/1993 | |
| JP | 6-260234 | 9/1994 | |
| JP | 10-510094 | 9/1998 | |
| JP | 11-513837 | 11/1999 | |
| JP | 2000-241498 | 9/2000 | |
| JP | 2001-083209 A | 3/2001 | |
| JP | 2002-343524 | 11/2002 | |
| JP | 2003022849 A * | 1/2003 | |
| JP | 2003059611 A * | 2/2003 | |
| JP | 2004-247216 A | 9/2004 | |
| JP | 2004247216 A * | 9/2004 | |
| JP | 2005-46993 | 2/2005 | |
| JP | 2005-142111 | 6/2005 | |
| JP | 2005142111 A * | 6/2005 | |
| WO | WO 96/17501 | 6/1996 | |
| WO | WO 03/007430 A1 | 1/2003 | |
| WO | WO2004108332 A1 * | 12/2004 | |

OTHER PUBLICATIONS

Translation of JP 2005-142111 A, Jun. 2005.*
Translation of JP1993-226022 A, Sep. 1993.*
Translation of JP 2003-022849 A, Jan. 2003.*
Translation of JP 2003-059511 A, Feb. 2003.*
Translation of JP 2004-247216 A, Sep. 2004.*
Chinese Office Action, w/ English translation thereof, issued in Chinese Patent Application No. CN 2006800126802 dated Jun. 19, 2009.
European Search Report issued in European Patent Application No. EP. 06 74 5939.6 dated Nov. 2, 2009.
Japanese Office Action, with English translation, issued in Japanese Patent Application No. 2005-244304, mailed Oct. 5, 2010.
Japanese Office Action, with partial English translation, issued in Japanese Patent Application No. 2005-244304, mailed Jun. 15, 2010.

* cited by examiner

ANISOTROPIC CONDUCTIVE SHEET, PRODUCTION METHOD THEREOF, CONNECTION METHOD AND INSPECTION METHOD

RELATED APPLICATIONS

This application is the U.S. National Phase under 35 U.S.C. §371 of International Application No. PCT/JP2006/309088, filed on May 1, 2006, which in turn claims the benefit of Japanese Application No. 2005-244304, filed on Aug. 25, 2005, the disclosures of which Applications are incorporated by reference herein.

TECHNICAL FIELD

The present invention relates to an anisotropic electroconductive sheet suitable for connecting with pin electrodes of a through-hole-mounting type. The present invention also relates to a connection method and an inspection method when the foregoing anisotropic electroconductive sheet is used. The present invention also relates to a production method of an anisotropic electroconductive sheet excellent in productivity.

BACKGROUND ART

An electrode pad provided on the surface of a package that houses an IC or LSI has two types: one is a ball grid array (BGA) that belongs to a surface-mounting type (BGA package), and the other is a pin grid array (PGA) that belongs to a through-hole-mounting type (PGA package). Of these, in the PGA package, pin electrodes protruding perpendicularly from the surface of a semiconductor package are inserted into an ordinary socket having mechanical terminals. Thus, the semiconductor package is mounted on a printed circuit board provided with the socket.

The types of the socket to be used for the PGA package include a low-inserting-force socket (LIF socket), a zero-inserting-force socket (ZIF socket), and a socket using an anisotropic electroconductive sheet.

The LIF socket is provided with (a) a made-of-resin base housing in which inserting holes are formed and (b) spring contacts that are held in the inserting holes of the base housing, extend through the base housing, and have tail portions that are soldered to a printed circuit board to which the socket is mounted. When the pin electrodes of the PGA package are placed in the inserting holes of the LIF socket, the spring contacts in the inserting holes are expanded or deflected. Thus, the elastic force of the spring contacts connects the pin electrodes with the spring contacts mechanically and electrically. Consequently, the PGA package is electrically connected with the printed circuit board to which the LIF socket is mounted (see the published Japanese patent application Tokukai 2002-343524 (Patent literature 1)).

The ZIF socket is provided with (a) a made-of-resin base housing in which inserting holes are formed in the shape of a grid, (b) a metallic contacts held in the inserting holes of the base housing, (c) a made-of-resin cover housing provided with through holes arranged in the shape of a grid through which pin electrodes can be inserted, (d) a sliding mechanism that slides the cover housing against the base housing, and (e) an operating lever. When the operating lever is turned upward or downward, the cover housing is slid against the base housing. Consequently, the PGA package is electrically connected with the printed circuit board to which the ZIF socket is mounted (see the published Japanese patent application Tokuhyouhei 11-513837 (Patent literature 2)).

As the socket using an anisotropic electroconductive sheet, there is a socket in which socket electrodes made of conductive rubber or the like are formed on an electrically insulating substrate, and the socket electrodes are provided with through holes for inserting the pin electrodes. As the conductive rubber, a material is used in which carbon or metallic particles are dispersed in organic rubber such as silicone rubber (see the published Japanese patent application Tokukaishou 63-259981 (Patent literature 3)). The socket electrodes made of conductive rubber are formed at the inner walls of metallic pipes that penetrate through the insulating substrate or formed at the metallic inner walls in the through holes of the substrate (see the published Japanese patent application Tokukaihei 05-226022 (Patent literature 4) and the published Japanese utility model application Jitsukaihei 03-091669 (Patent literature 5)). The foregoing Patent literatures state that these anisotropic electroconductive sheets can provide stable connection regardless of the shape of the inserted pin electrodes, and the pin electrodes are reliably held on account of the flexibility of the conductive rubber.

Patent literature 1: the published Japanese patent application Tokukai 2002-343524
Patent literature 2: the published Japanese patent application Tokuhyouhei 11-513837
Patent literature 3: the published Japanese patent application Tokukaishou 63-259981
Patent literature 4: the published Japanese patent application Tokukaihei 05-226022
Patent literature 5: the published Japanese utility model application Jitsukaihei 03-091669

DISCLOSURE OF THE INVENTION

Problem to be Solved by the Invention

The LIF socket has a problem in that a large elastic force is provided to electrically connect the spring contact with the pin electrode, so that a high inserting force is required to insert the pin electrode. As a result, the pin electrode may be damaged, or in a PGA package having a large number of pins (for example, 300 pins or more), a high inserting force may be required to such an extent that the force damages the printed circuit board at the time the PGA package is mounted. On the other hand, although the ZIF socket only needs a low inserting force, it has a problem in that the slide mechanism must be provided. Consequently, the ZIF socket is difficult to become small-size, to have a reduced thickness, and to have a fine-pitch structure in the electrode portion.

In addition, the socket made of conductive rubber has a problem in that because the conductive rubber has a high coefficient of friction, as with the LIF socket, a high inserting force is required. Furthermore, the socket electrode is formed at the inner wall of the metallic pipe that penetrates through the insulating substrate or formed at the metallic inner wall in the through hole of the substrate. Such a complicated rubber structure is difficult to form, thereby increasing the production cost. Moreover, an external force is applied when the pin electrode is inserted or withdrawn. Consequently, the socket electrode made of conductive rubber tends to be separated from the metallic inner wall due to the external force, thereby reducing the operating life.

An object of the present invention is to offer an anisotropic electroconductive sheet suitable for connecting with pin electrodes of a through-hole-mounting type and to offer a production method thereof. Another object is to offer a connection method and an inspection method when the foregoing anisotropic electroconductive sheet is used.

Means to Solve the Problem

An anisotropic electroconductive sheet of the present invention has electrical conductivity in the direction of thickness. The sheet comprises a base film formed by using a porous film that is made of synthetic resin and that has electrically insulating property. The porous film is provided with a plurality of holes that are formed in the direction of thickness so that pin electrodes can be through-hole-mounted. The inner walls of the holes are coated with metals. The inserted pin electrodes become electrically continuous, through the metals, with the surface opposite to the surface from which the pin electrodes are inserted. When the pin electrodes to be through-hole-mounted have sharp ends or when they are required to be repeatedly inserted or withdrawn in the inspection use, the pin electrodes must be easily through-hole-mounted and the porous film must be prevented from being damaged by the pin electrodes. To meet this requirement, it is desirable that the porous film have, at the side from which the electrodes are through-hole-mounted, a nonporous film that is made of synthetic resin and that has electrically insulating property and the nonporous film be provided with a plurality of holes that are formed in the direction of thickness so that the pin electrodes can be through-hole-mounted.

It is desirable to be able to form the holes as through holes. It is desirable that the opening portion from which the pin electrodes are inserted have a tapered structure. It is desirable that the porous film be an expanded polytetrafluoroethylene film and that the nonporous film be a nonporous polytetrafluoroethylene film. In addition, it is desirable that the nonporous film be a film obtained by applying a polymerizable monomer onto the porous film and then by curing the monomer.

A production method of the present invention is a method of producing the foregoing anisotropic electroconductive sheet. The method has a feature in that the holes are formed by irradiation with x-rays of synchrotron radiation or laser light. Alternatively, the holes may be formed by using a drill or by punching. A connection method of the present invention has a feature in that the pin electrodes are through-hole-mounted in the holes of the above-described anisotropic electroconductive sheet. An inspection method of the present invention has a feature in that the pin electrodes are through-hole-mounted in the holes of the above-described anisotropic electroconductive sheet.

Effect of the Invention

An anisotropic electroconductive sheet of the present invention enables the inserted pin electrodes of a PGA package to become electrically continuous with the surface opposite to the surface from which the pin electrodes are inserted. Moreover, because the pin electrodes can be through-hole mounted with a low inserting force, the inserted pin electrodes can be suppressed from being damaged. In addition, the sheet connects with the through-hole-mounted pin electrodes such that it softly enclose the electrodes, so that it can flexibly accommodate the positional deviation in the pin electrodes. Even when the pin electrodes have sharp ends, they are easily inserted. Even when the pin electrodes are repeatedly inserted and withdrawn in the inspection use, the entrance of the holes has resistance to damage, so that stable and reliable electrical connection can be achieved. Furthermore, the sheet is easy to become small-size, to have a reduced thickness, and to have a fine-pitch structure in the electrode portion. As a result, the sheet can satisfy needs for miniaturization that is directed to electronic devices and information devices.

EXPLANATION OF THE SIGN

1, 61*a*: Porous film; 2, 22, and 62: Pin electrode; 3, 23, and 63: Hole; 4, 24, and 64: metal; 20: Anisotropic electroconductive sheet; 21 and 61: Base film; 38: X-rays; 48*a* and 48*b*: Drill; 61*b*: Nonporous film.

BEST MODE FOR CARRYING OUT THE INVENTION

Anisotropic Electroconductive Sheet

Figure 1:
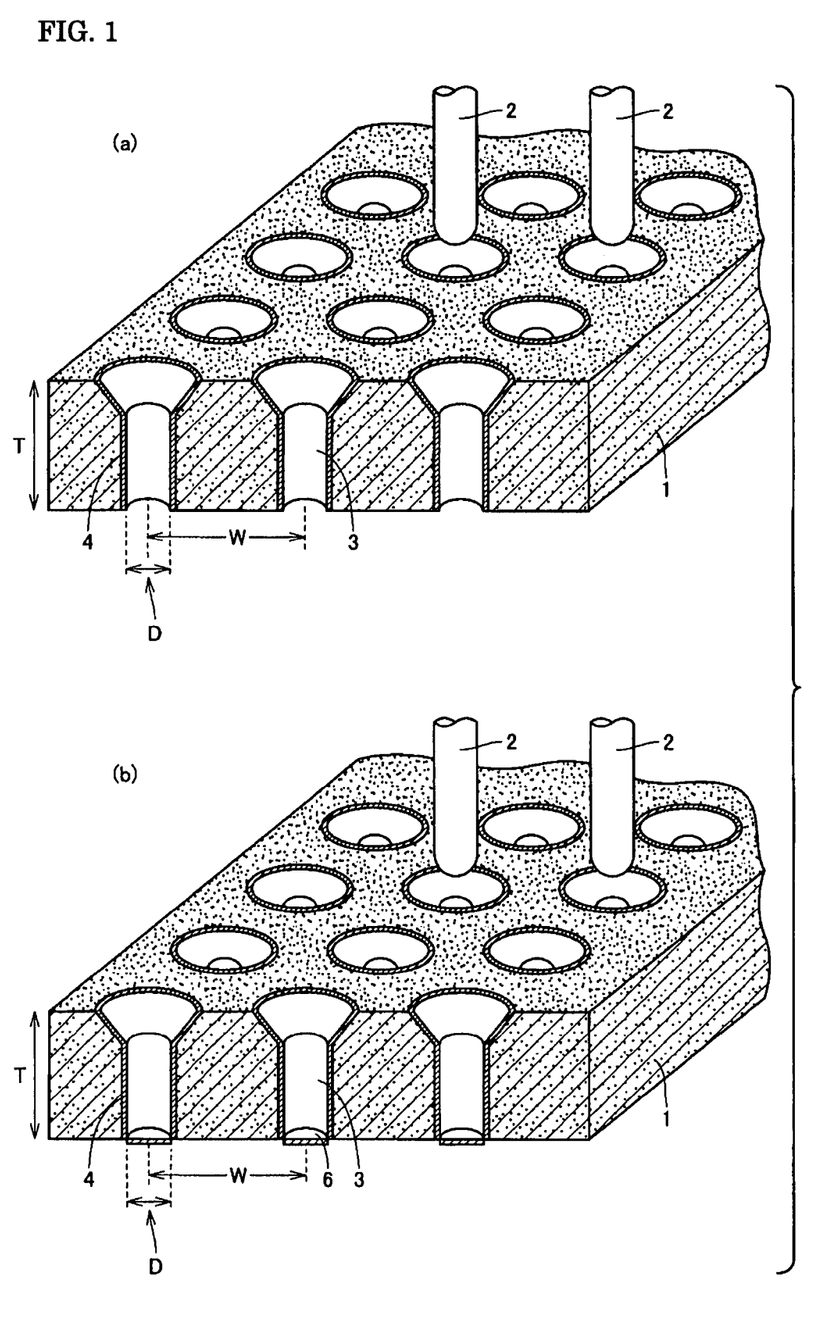
FIG. 1 is an illustration showing the basic structure of an anisotropic electroconductive sheet of the present invention.

As shown in FIG. 1, an anisotropic electroconductive sheet of the present invention is an anisotropic electroconductive sheet having electrical conductivity in the direction of thickness. In this sheet, the base film is formed by using a porous film 1 that is made of synthetic resin and that has electrically insulating property. The porous film 1 is provided with a plurality of holes 3 that are formed in the direction of thickness so that pin electrodes 2, such as a PGA, can be through-hole-mounted. The inner walls of the holes 3 are coated with metals 4. The inserted pin electrodes 2 become electrically continuous, through the metals 4, with the surface opposite to the surface from which the pin electrodes 2 are inserted. FIG. 1(*a*) shows an example in which the holes 3 are through holes. Alternatively, as shown in FIG. 1(*b*) as an example, the holes 3 may be closed with conductors 6.

Figure 2:
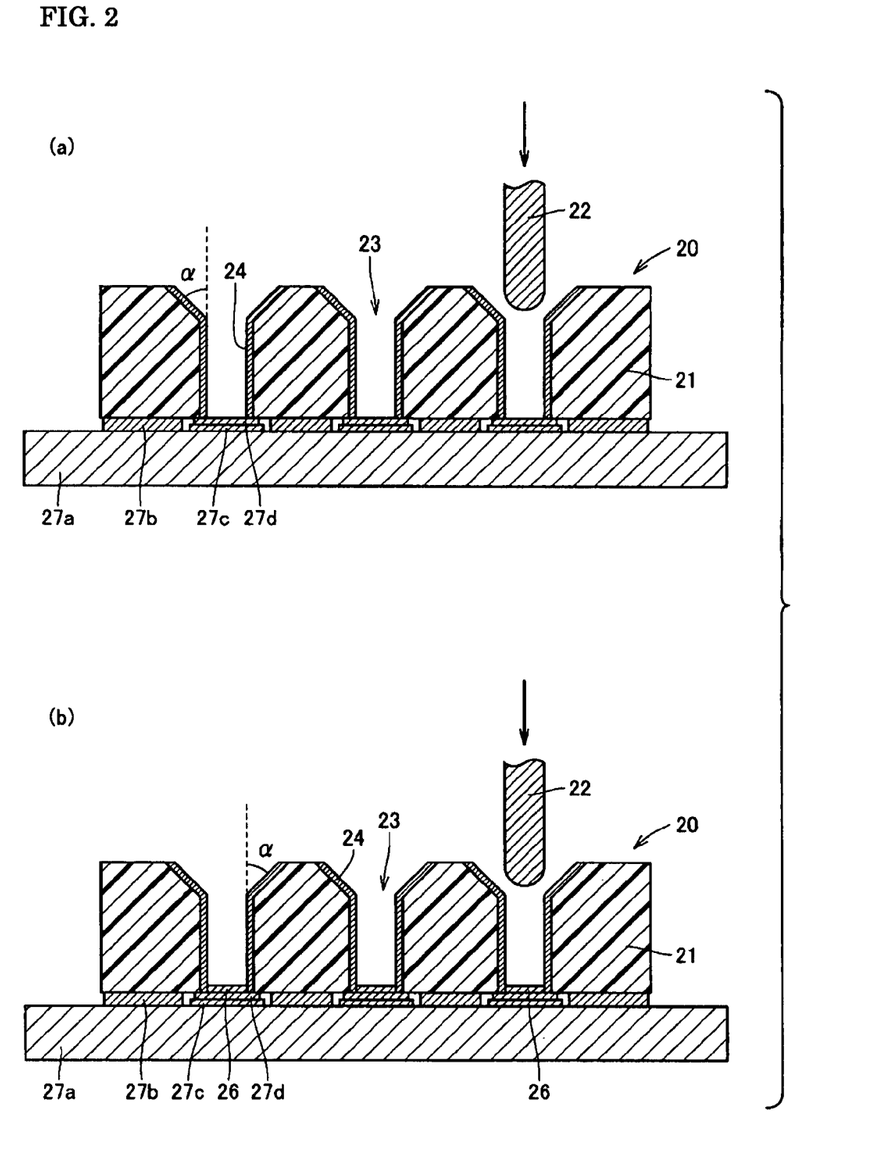
FIG. 2 is a cross-sectional view showing a state in which an anisotropic electroconductive sheet of the present invention is implemented.
Figure 5:
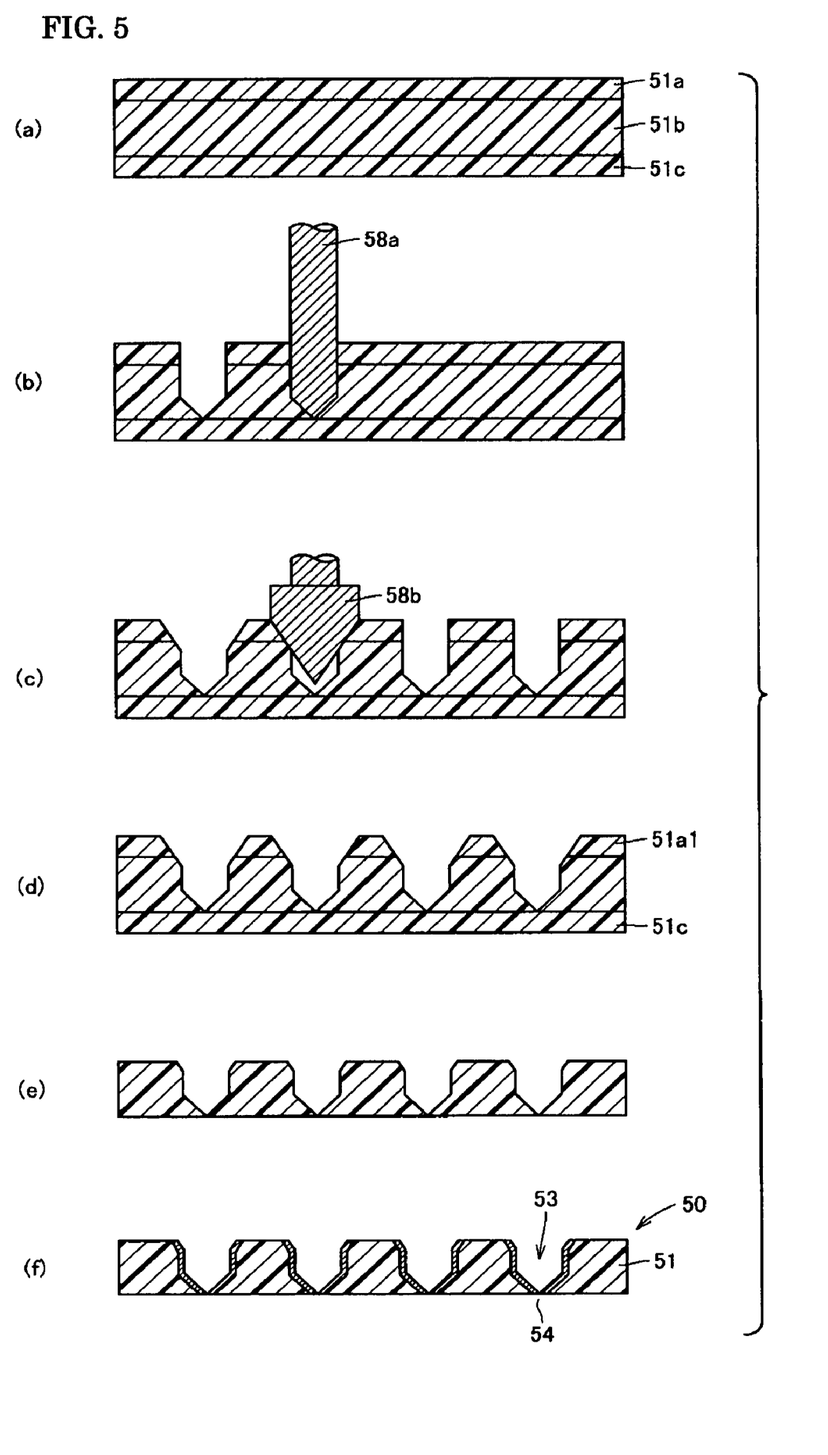
FIG. 5 is a process-flow diagram showing a method of producing an anisotropic electroconductive sheet of the present invention.

FIG. 2 shows an example of a state in which an anisotropic electroconductive sheet 20 of the present invention is implemented. As shown in FIG. 2(*a*), the anisotropic electroconductive sheet 20 is bonded with a measuring substrate 27*a* through an adhesive 27*b*, a viscous material, or the like. Under this condition, electrode heads 27*c* on the measuring substrate 27*a* are connected, through solders 27*d*, with metals 24 provided on the inner walls of holes 23 formed in a base film 21. Therefore, when pin electrodes 22, such as a PGA, are through-hole-mounted in the holes 23, the pin electrodes 22 become electrically continuous with the electrode heads 27*c* on the measuring substrate through the metals 24. On the other hand, as shown in FIG. 2(*b*) as an example, when the holes 23 are closed with conductors 26, the conductors 26 are solder-bonded with the electrode heads 27*c*. The providing of the conductors 26 can enhance the bonding strength and electrical continuity with the electrode heads 27*c* on the measuring substrate 27*a*. Alternatively, as shown in FIG. 5(*f*), holes 53 may be formed to some midpoint of a base material 51 without forming through holes. In this case, the electrical continuity with the pin electrodes can be achieved through metals 54 attached on the inner walls of the holes 53.

As shown in FIG. 2, when the pin electrodes 22, such as a PGA, are fitted into the holes 23 in the base film 21, the pin electrodes 22 can become electrically continuous with the electrode heads 27c on the measuring substrate 27a through the metals 24 on the inner walls of the holes 23. More specifically, in the example shown in FIG. 2, the base film 21 is a porous elastic sheet made of synthetic resin. Because it is flexible, when the pin electrodes 22 are inserted into the holes 23 of the anisotropic electroconductive sheet 20, the pin electrodes 22 can be softly connected such that the pin electrodes 22 are closely enclosed with the inner walls of the holes 23. Consequently, even when the semiconductor package or the like is thermally expanded or contracted due to temperature variations, the variation in the position of the pin electrodes 22 can be absorbed. Thus, the anisotropic electroconductive sheet 20 can follow the deviation in the position of the pin electrodes while maintaining the electrical connection. Therefore, according to the connection method of the present invention in which the pin electrodes 22 are through-hole-mounted in the holes 23 of the anisotropic electroconductive sheet 20, flexible and reliable connection can be achieved. In addition, an inspection method of the present invention that uses the foregoing connection method is useful as an inspection method for a semiconductor package and the like.

As shown in FIG. 2, it is desirable that the opening portion of the holes 23 from which the pin electrodes 22 are inserted have a tapered structure. The tapered structure allows the pin electrodes 22 to be smoothly inserted. Furthermore, even when the pitch of the pin electrodes is deviated to a certain extent, the pin electrodes can be inserted. In other words, when the tapered structure is provided, positional deviation can be accommodated flexibly. From the foregoing viewpoint, it is desirable that the tapered angle $\alpha$ be 30 to 60 degrees, more desirably 40 to 50 degrees. For example, a tapered angle of 45 degrees may be employed. In addition, when the head electrodes of the measuring substrate are pin electrodes, it is desirable that each of both openings of the through holes have a tapered structure.

The base film is an electrically insulating film made of synthetic resin. The use of an electrically insulating material enables the securing of the insulating property in the direction of the surface of the base film, so that the mutual influence between the neighboring pin electrodes can be eliminated. On the other hand, the base film is provided with a plurality of holes formed in the direction of thickness, and the inner walls of the holes are coated with metals so as to obtain electrical conductivity through the metals. Consequently, an electroconductive sheet of the present invention is an anisotropic electroconductive sheet. It has electrical conductivity only in the direction of thickness, so that electrical contact can be established only with specified pin electrodes.

It is desirable that the synthetic resin for forming the porous film be polyester, polyamide, polyolefin, polyurethane, or the like, because they have electrically insulating property and flexibility. They can be used in the form of a film, woven fabric, nonwoven fabric, or the like. It is more desirable to use a fluorine-substituted polymer, because resistance to heat is required in a burn-in test, and the polymer is excellent in resistance to chemical attack, processibility, mechanical property, dielectric property (low dielectric constant), and so on. The types of the fluorine-substituted polymer include polytetrafluoroethylene (hereinafter also referred to as "PTFE"), a tetrafluoroethylene hexafluoroethylene copolyer, a tetrafluoroethylene perfluoroalkylvinylether copolymer, polyvinylidene fluoride, a polyvinylidene fluoride copolymer, and an ethylene tetrafluoroethylene copolymer. It is particularly desirable to use expanded polytetrafluoroethylene with respect to resistance to heat, processibility, and mechanical property. The material can maintain its elasticity even at temperatures as high as 200° C. or more or as low as −30° C. or less, so that it can maintain stable connection. Furthermore, the useable materials include engineering plastics such as polyimide, polyamide imide, modified polyphenylene ether, polyphenylene sulfide, polyether ether ketone, polysulfone, polyether sulfone, and a liquid crystal polymer.

Moreover, the porous film has elasticity and flexibility. Consequently, the use of the porous material as the base film enables the pin electrode to be through-hole mounted with a low inserting force. In addition, the faulty contact due to positional deviation in the pin electrodes can be alleviated, and soft and secure connection can be accomplished. From such a viewpoint, it is desirable that the pores contained in the porous material have an average pore diameter of at most 10 μm or a bubble point of at least 2 kPa. From the viewpoint of the realization of a fine pitch in the electrically continuous portions, it is more desirable that the average pore diameter be at most 1 μm or the bubble point be at least 10 kPa. If the average pore diameter is more than 10 μm or the bubble point is less than 2 kPa, the strength of the film becomes low and consequently the handling of the film tends to become difficult.

It is desirable that the porous material have a porosity in the range of 20 to 80 percent. If the porosity is less than 20 percent, the elasticity and flexibility tend to become insufficient as the porous material. On the other hand, if the porosity is more than 80 percent, the strength tends to become insufficient. In the above description, the term "porosity" is defined as the ratio (percent) of the volume in the pore portions to the total volume of the porous material.

The thickness T of the base film shown in FIG. 1 can be at most 3 mm when the holes 3 are formed by using x-rays of synchrotron radiation, laser light, or a drill, as described below. In view of the securing of the flexibility of the sheet and the increasing of the contact area between the metal attached on the inner walls of the holes and the surface of the pin electrodes, it is desirable that the thickness T be large. Nevertheless, when the processibility and other properties are taken into consideration, it is desirable that the thickness T be 0.5 to 2 mm. For example, a thickness of 1 mm may be employed in a design.

It is desirable that the inner diameter D of the holes 3 be as small as 60 to 90 percent or so the outer diameter of the pin electrodes 2 so that the inserted pin electrodes 2 can be reliably held. For example, the inner diameter D may be designed to be 200 μm. As described above, even when the inner diameter D of the holes 3 is designed to be smaller than the outer diameter of the pin electrodes 2, the tapered structure at the opening portion of the holes 3 enables the reliable insertion of the pin electrodes 2. The spacing W between neighboring holes 3 may be designed in accordance with the positioning pattern of the pin electrodes 2 to be implemented. For example, the spacing W may be designed to be 1 mm.

According to the present invention, the metals 4 may be formed, for example, by plating on the surface of the inner walls of the holes 3 by utilizing the catalyst adhering and remaining on the surface of the inner walls. As the plating method, it is desirable to use the nonelectrolytic plating method. First, before the nonelectrolytic plating is performed, the catalyst (palladium-tin) remaining on the surface of the inner walls of the holes 3 is activated. More specifically, when the porous film is immersed in, for example, an organic acid salt commercially available for the use to activate a plating catalyst, the tin is dissolved to activate the palladium catalyst.

Next, the porous film that has the catalyst adhering on the surface of the inner walls of the holes 3 is immersed in a nonelectrolytic plating solution. The immersion deposits conductive metal only on the surface of the inner walls of the holes 3 to form tubular conductive portions (also referred to as "conductive paths" or "electrodes"). The types of the conductive metal include copper, nickel, silver, gold, and a nickel alloy. When particularly high conductivity is required, it is desirable to use copper.

When an expanded porous PTFE sheet is used as the porous film, plating particles (crystal grains) are first deposited in such a way that they tangle themselves with fibrils exposed on the surface of the inner walls of the holes made in the porous PTFE sheet. By adjusting the plating period, the state of deposition of the conductive metal can be controlled. When a proper amount is plated, conductive metal layers are formed while the porous structure is maintained. Thus, not only a sufficient elasticity and flexibility but also the electrical continuity in the direction of film thickness can be achieved.

When the pin electrodes 2 are through-hole-mounted, the holes 3 are expanded by the pin electrodes 2. Then, the elasticity presses the conductive metals 4 to the pin electrodes 2. As a result, the pin electrodes 2 are electrically connected to the conductive metals 4 with reliability. Consequently, the pin electrodes 2 can have electrical continuity with the surface opposite to the surface from which the pin electrodes are inserted. Furthermore, when the pin electrodes 2 are withdrawn, the shape of the porous film and the holes 3 is restored to the original state by the action of the elasticity. Therefore, even in the case where pin electrodes are required to be repeatedly inserted and withdrawn as in the case for inspection use, the anisotropic electroconductive sheet can be used. If the nonelectrolytic plating period is excessively short, it will become difficult to secure a sufficient electrical continuity. In contrast, if the nonelectrolytic plating period is excessively long, the conductive metal will grow to a lump of metal, rendering it difficult to make elasticity recovery for the porous film and the holes 3.

It is desirable that the diameter of the resin portion of the porous structure be at most 50 μm. In the above description, the term "the diameter of the resin portion" means, for example, the diameter of the fibril of the expanded porous PTFE sheet. It is desirable that the conductive metal have a particle diameter of 0.001 to 5 μm or so. To maintain the porous structure and elasticity, it is desirable that the deposited amount of the conductive metal be 0.01 to 4.0 g/cm$^3$ or so.

It is desirable that the tubular electrically continuous portion produced as described above be coated with an oxidation inhibitor, or precious metal, or its alloy to enhance the oxidation prevention and the electrical contactability. As the precious metal, it is desirable to use palladium, rhodium, or gold because they have low electrical resistivity. It is desirable that the coating of the precious metal and the like have a thickness of 0.005 to 0.5 μm, more desirably 0.01 to 0.1 μm. If the thickness of the coating is excessively thin, the effect of improving the electrical contactability is small. If excessively thick, the coating tends to peel off. For example, in the case where the electrical-continuity portion is coated with gold, the following method is effective. First, the coating is performed with nickel having a thickness of 8 nm or so, and then substitutional gold plating is carried out.

Figure 6:
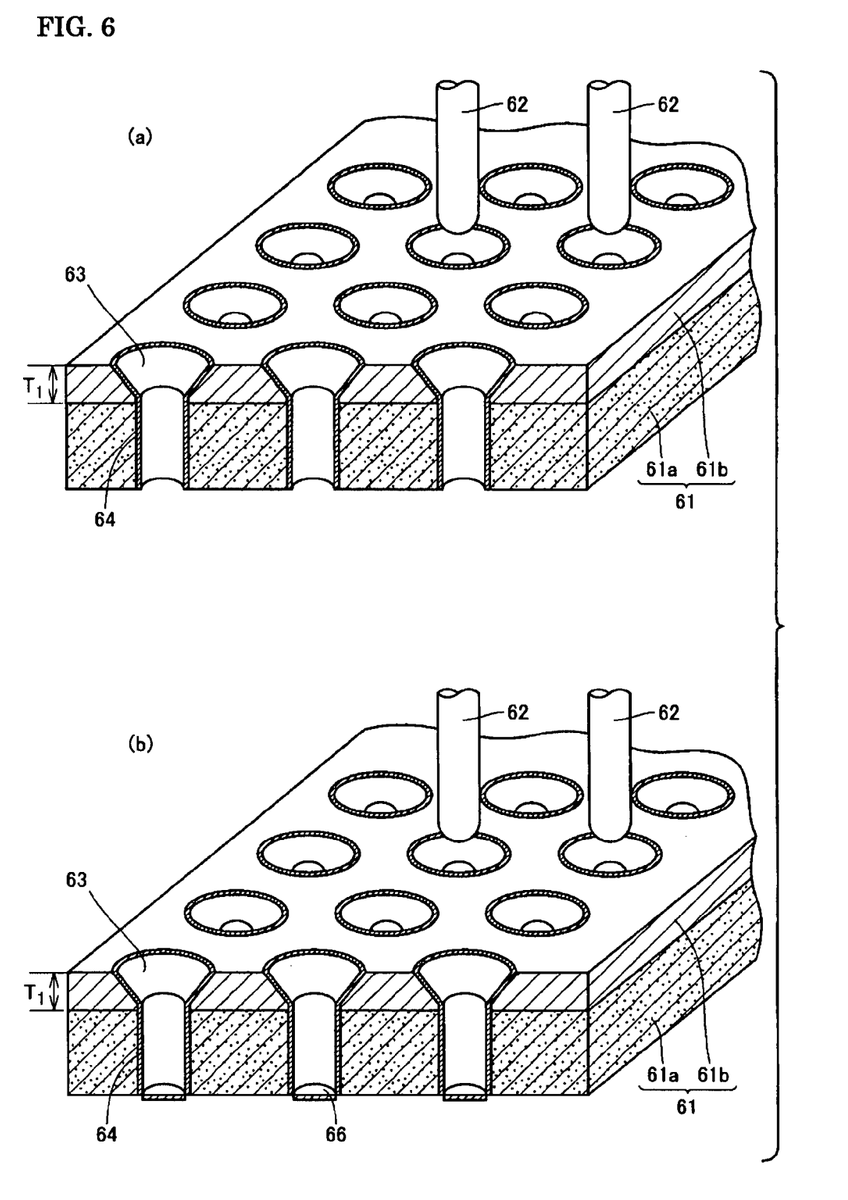
FIG. 6 is an illustration showing the basic structure of an anisotropic electroconductive sheet of the present invention.

FIG. 6 shows another example of an anisotropic electroconductive sheet of the present invention. As can be seen from FIG. 6, in this anisotropic electroconductive sheet, a porous film 61a has a nonporous film 61b that is made of synthetic resin and that has electrically insulating property at the side from which pin electrodes 62 are through-hole-mounted. The nonporous film 61b is provided with a plurality of holes 63 that are formed in the direction of thickness so that the pin electrodes 62 can be through-hole-mounted. The holes 63 communicate with the holes in the porous film 61a. FIG. 6(a) shows an example in which the holes are through holes. Alternatively, FIG. 6(b) shows an example in which the holes are closed with conductors 66.

In the example shown in FIG. 6, the opening portion from which the pin electrode 62 is inserted has a tapered structure. Consequently, at the time the pin electrodes 62 are inserted into the holes 63, even when the pitch of the pin electrodes is deviated, the pin electrodes can be securely through-hole-mounted to achieve electrical continuity. Furthermore, when the base film 61 has the nonporous film 61b in addition to the porous film 61a, because the nonporous film is harder than the porous film, the processed surface can become smooth, decreasing the coefficient of friction. Consequently, the nonporous film has resistance to deformation and shaving-off. Therefore, even when the pin electrodes have sharp ends, they can be smoothly through-hole-mounted without being caught at the entrance of the holes. Moreover, in the inspection use, even when the pin electrodes are used by repeatedly inserting and withdrawing them, the entrance of the holes has little tendency to be damaged. As a result, stable and reliable electrical connection can be achieved. After the pin electrodes are through-hole-mounted, the pin electrodes are connected to the metals 64 attached to the inner walls of the holes such that the pin electrodes are closely enclosed with the metals 64. Because the porous film 61a has elasticity and flexibility, even when the pin electrodes have positional deviation, the porous film 61a can follow the pin electrodes flexibly while maintaining the electrical connection.

The nonporous film 61b is required to have properties comparable to those of the porous film in electrically insulating property, resistance to heat, resistance to chemical attack, and dielectric property (low dielectric constant). However, the nonporous film must play a role of guide when the pin electrodes are through-hole-mounted. Therefore, it is desirable that the nonporous film have, in addition to the properties required to the porous film, a low coefficient of friction against the pin electrodes, a mechanical strength to such an extent that it can withstand without being shaved off when the pin electrodes are pressed to it, and a coefficient of elasticity to such an extent that it is free from deformation when the pin electrodes are pressed to it. In view of the above-described properties, it is desirable that the nonporous film be made of synthetic resin similar to the above-described synthetic resin used for the porous film. More specifically, it is desirable to use a fluorine-substituted polymer in terms of the low coefficient of friction, mechanical strength, and coefficient of elasticity. In particular, it is more desirable to use nonporous PTFE.

The nonporous film 61b is required to provide a smooth surface for the inner walls of the opening portions of the holes 63 so that the pin electrodes 62 can be smoothly through-hole-mounted. In this respect, it is desirable that the nonporous film 61b have a surface roughness of at most 10 μm in arithmetic-mean roughness, more desirably at most 1 μm. The catalyst of the nonelectrolytic plating is deposited only on the surface of the inner walls of the holes in the porous film without being deposited on the surface of the inner walls of the holes in the nonporous film. Consequently, the metal is not attached to the surface of the inner walls of the holes in the nonporous film.

Therefore, when the thickness of the nonporous film is increased, the length of the electrically continuous portion is decreased. As a result, the contact area between the pin electrode and the electrically continuous portion is decreased, thereby increasing the value of the resistance. In view of this aspect, it is desirable that the thickness $T_1$ of the nonporous film be at most 60 percent the total thickness of the sheet comprising the nonporous film and porous film, more desirably at most 50 percent. On the other hand, if the thickness of the nonporous film is small, the film does not serve as the guide. Therefore, it is desirable that the thickness of the nonporous film be at least 10 percent the total thickness of the sheet, more desirably at least 20 percent. In this case, the total thickness of the sheet can be at most 3 mm. In view of the securing of the flexibility of the sheet and the increasing of the contact area between the metal attached on the inner walls of the holes and the surface of the pin electrodes, it is desirable that the total thickness of the sheet be large. Nevertheless, when the processibility and other properties are taken into consideration, it is desirable that the total thickness of the sheet be 0.5 to 2 mm. For example, a thickness of 1 mm may be employed in a design.

The nonporous film has a flexibility and an elasticity each smaller than that of the porous film. Consequently, if the nonporous film has a portion in which the inner diameter of the hole 63 is smaller than the outer diameter of the pin electrode, a large force will be required to through-hole-mount the package. Therefore, it is desirable that the minimum value of the inner diameter of the holes 63 at the nonporous film be greater than the outer diameter of the pin electrodes 62.

The nonporous film must be bonded with the porous film such that the bonded face is not easily separated even when the electrodes are through-hole-mounted or withdrawn at the time of repeated contacts in the inspection or another use. In this respect, it is desirable that the bonding be performed by using the heat fusion method or through an adhesive. For example, an expanded porous PTFE film can be bonded with a nonporous PTFE film by heat fusing at 350° C. and 100 g/cm² for 2 hours. By this bonding, a base film can be obtained that has a bonded face not easily separated even when the contact is repeated. Alternatively, a polyimide nonporous film can be strongly bonded with an expanded porous PTFE film through an epoxy resin-based adhesive. As the adhesive, it is desirable to use an epoxy resin-based adhesive, polyimide-based adhesive, acrylic adhesive, methacrylic adhesive, oxetan-based adhesive, hot-melt adhesive, and so on. From the viewpoint of the resistance to heat, mechanical strength, and bonding strength, it is desirable to use an epoxy resin-based adhesive or polyimide-based adhesive.

Alternatively, a nonporous film can also be obtained by applying a polymerizable monomer onto a porous film and then curing it. It is desirable to use thus obtained nonporous film in that it does not peel off easily even when the contact is repeated. Furthermore, the monomer is a liquid before it is cured. Therefore, the monomer is easy to form the shape and consequently the thickness of the film can be easily adjusted. When a protruding-type mold is used, the tapered shape can be formed concurrently with the curing operation, thereby enabling the elimination of the step for separately forming the tapered shape. The types of the polymerizable monomer include a thermosetting resin and an ultraviolet cure resin, for example. The types of the thermosetting resin include an epoxy resin, polyimide resin, acrylic resin, methacrylic resin, and oxetan resin. It is desirable to add a thermal-polymerization initiator, such as a peroxide, according to the type of the resin as required.

It is desirable to prepare the ultraviolet cure resin as follows. A resin similar to that used for the thermosetting resin is used. As the polymerization initiator, in place of the thermal-polymerization initiator, a hydrogen-abstraction-type or cleavage-type radical photopolymerization initiator, cation photopolymerization initiator, or the like is added to the resin in accordance with the type of the resin and the applied thickness. As the hardening monomer, it is particularly desirable to use an epoxy resin with respect to the resistance to heat, mechanical strength, and flexibility.

Method of Producing an Anisotropic Electroconductive Sheet

Embodiment 1

Figure 3:
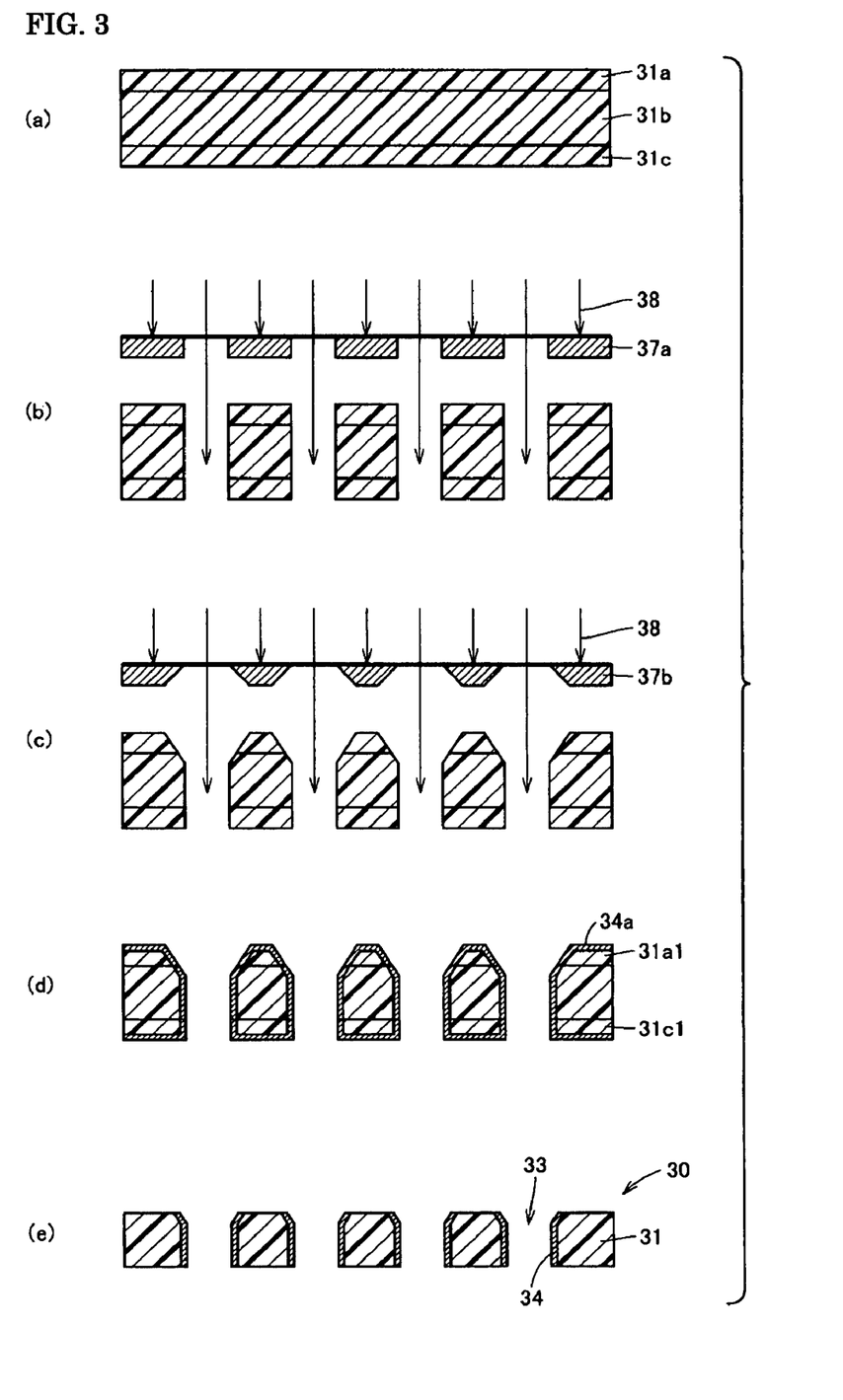
FIG. 3 is a process-flow diagram showing a method of producing an anisotropic electroconductive sheet of the present invention.

According to the present invention, a method of producing an anisotropic electroconductive sheet has a feature in that the method forms the holes by irradiation with x-rays of synchrotron radiation or laser light. FIG. 3 shows, as an example, an outline of the production method. First, as shown in FIG. 3(a), sacrifice layers 31a and 31c are formed on the two main surfaces of a base film 31b, such as a PTFE sheet having a thickness of 600 μm. It is desirable that the sacrifice layers 31a and 31c be made of PTFE, which is the same material as that of the base film 31b, so as to increase the bonding ability with and separating ability from the base film 31b. The sacrifice layers 31a and 31c, each having a thickness of 100 μm or so, can be formed by heat fusion.

Next, as shown in FIG. 3(b), the sheet is irradiated with x-rays 38 of synchrotron radiation or laser light through a mask absorber 37a that is made of tungsten or the like and that has a specified pattern. In the base film, the portions exposed to the rays or light are decomposed to form holes penetrating through the sheet in the direction of thickness. This process produces a structured body formed only of the base film's portions that are shielded with the mask absorber 37a against the rays or light.

It is desirable to use x-rays of synchrotron radiation to form the holes. The ablation by using x-rays of synchrotron radiation enables a concurrent formation of a plurality of specified holes with only one step of exposure to the rays, eliminating the developing step after the exposure. In addition, because the ablation rate is as high as 100 μm/min, the photon cost can be significantly reduced. This method easily realizes a processing for a large aspect ratio having a height of several-thousand micrometers and a width of several-ten micrometers. Alternatively, laser light can also form specified holes. In this case, the size and cost of the device are small, and the processing can be performed easily. In particular, when laser light having a pulse as short as at most 10 ps is used, the holes can be formed without destroying the microstructure of the porous film.

Next, as shown in FIG. 3(c), when a tapered structure is to be formed at the opening portion of the holes, the sheet is irradiated with the x-rays 38 of synchrotron radiation or laser light through a mask absorber 37b having a cross section of a specified tapered structure. In this case, the base film is exposed to the rays or light according to the tapered structure of the mask absorber 37b, is decomposed accordingly, and, as a result, can form a tapered structure at the opening portion of the holes.

Subsequently, as shown in FIG. 3(d), nonelectrolytic plating is performed to deposit metals 34a. The plating method can give electrical conductivity simultaneously. Consequently, it has excellent productivity and enables mass production. When nonelectrolytic copper plating is performed, the following method can be employed, for example. First, predipping is performed using CR-3023 made by Nikko Metal Plating Co. Next, as the catalyst, CP-3316 made by Nikko Metal Plating Co. is used. As the plating promoter, NR-2A and NR-2B both made by Nikko Metal Plating Co. are used. Then, the nonelectrolytic copper plating is performed using NKM554 made by Nikko Metal Plating Co.

Finally, when the sacrifice layers 31a1 and 31c1 are peeled off, an anisotropic electroconductive sheet 30 of the present invention can be obtained as shown in FIG. 3(e). The anisotropic electroconductive sheet 30 has a base film 31, which is a porous PTFE sheet having electrically insulating property. The sheet is provided with a plurality of holes 33 formed in the direction of thickness so that pin electrodes can be through-hole-mounted. The inner walls of the holes 33 are coated with metals 34. The sheet can be electrically continuous with the inserted pin electrodes through the metals 34. In other words, the sheet is an anisotropic electroconductive sheet having electrical conductivity in the direction of thickness.

It is desirable that the metals 34 be coated with an oxidation inhibitor, or precious metal, or its alloy to enhance the oxidation prevention and the electrical contactability. As the precious metal, it is desirable to use palladium, rhodium, or gold, because they have low electrical resistivity. It is desirable that the coating of the precious metal and the like have a thickness of 0.005 to 0.5 µm, more desirably 0.01 to 0.1 µm.

Embodiment 2

Figure 4:
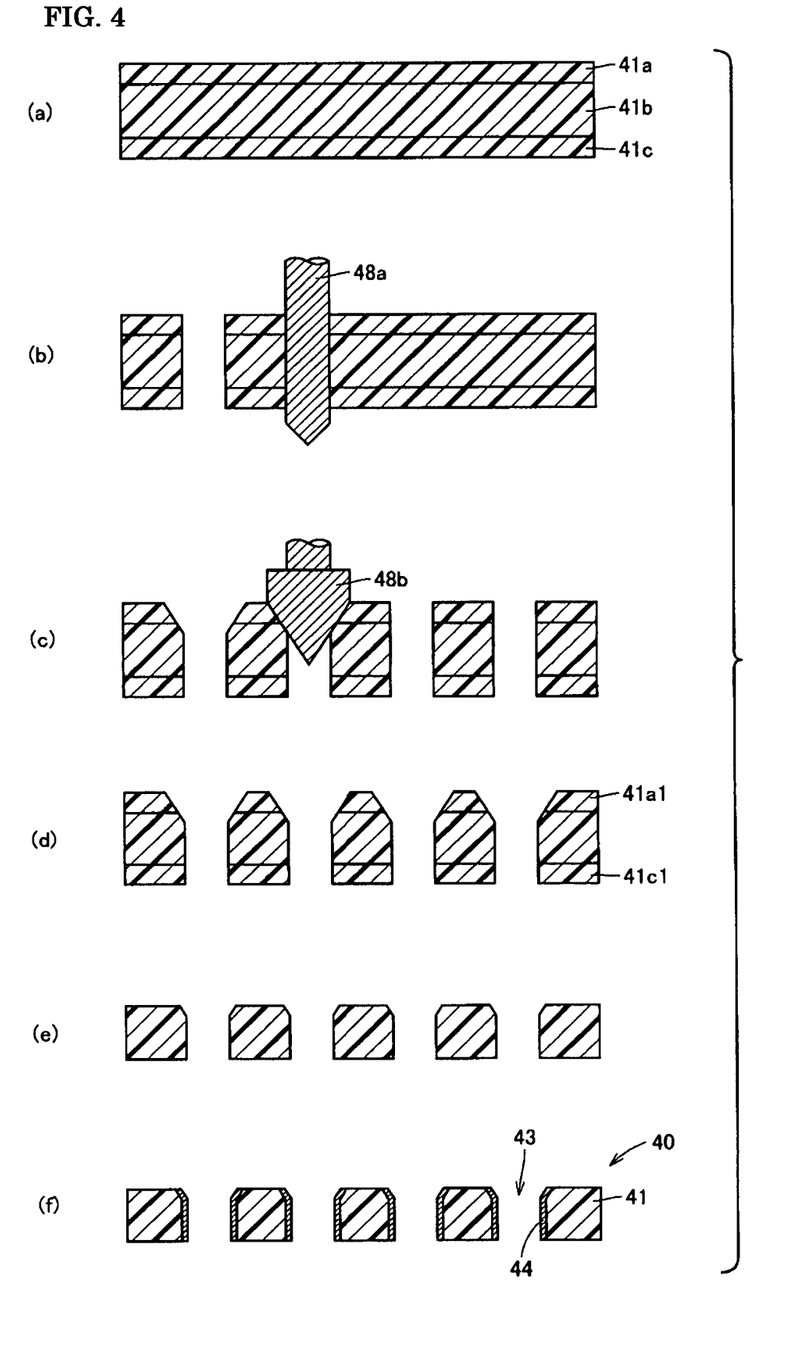
FIG. 4 is a process-flow diagram showing a method of producing an anisotropic electroconductive sheet of the present invention.

According to the present invention, another method of producing an anisotropic electroconductive sheet has a feature in that the method forms the holes by using a drill or by punching. FIG. 4 shows an outline of the production method. First, as shown in FIG. 4(a), sacrifice layers 41a and 41c, each of which has a thickness of 100 µm and is made of PTFE, are formed on the two main surfaces of a base film 41b, which is a PTFE sheet having a thickness of 1 mm in this case.

Next, as shown in FIG. 4(b), holes penetrating through the sheet in the direction of thickness are formed by using a drill 48a. Although the specified holes can be formed by using x-rays of synchrotron radiation or laser light, the device for generating the rays or light is expensive. In place of using such an expensive device, when a microdrill is used to form the holes, the production cost can be reduced. For example, when a drill having a cutting-portion diameter of at least 100 µm and a cutting-portion length of at least 1.5 mm (such as the superhard microdrill SCMMR made by Daiwa Seiko Co.) is used, a hole having an inner diameter of at least 100 µm can be formed easily. Subsequently, as shown in FIG. 4(c), partial machining can be performed using a larger-diameter drill 48b to form a tapered structure at the opening portion of the hole.

To further improve the machinability, it is desirable that the pore portion of the porous PTFE sheet be filled with heat-melted paraffin and then the paraffin be cooled to be solidified. This treatment can suppress the pore portion of the porous PTFE from deforming and collapsing due to the mechanical load at the time of drilling. After the holes are formed, the paraffin that fills the pore portion is removed by using, for example, xylene.

Alternatively, the holes can be formed by punching. The punching is performed using a punch and a die. For example, by using a punch provided with a columnar tooth having a diameter of 300 µm and a length of 2 mm and a die provided with a hole having an inner diameter of 320 µm and a thickness of 1 mm, a PTFE sheet can be punched. In this method, also, to improve the machinability, it is desirable that the pore portion of the porous PTFE sheet be filled with heat-melted paraffin and then the paraffin be cooled to be solidified. This treatment can suppress the pore portion of the porous PTFE sheet from deforming and collapsing due to the mechanical load at the time of punching. After the holes are formed, the paraffin that fills the pore portion is removed by using a xylene solution.

After the drilling or punching, the side wall of the mechanically formed holes of the PTFE sheet is sometimes roughened or the pores at the wall are sometimes collapsed. Consequently, it is desirable to slightly etch the side wall with an etching solution to recover the pore portions at the side wall. It is desirable to perform the etching by using an etching solution containing alkaline metal. As the alkaline metal, it is desirable to use sodium or lithium.

Next, as shown in FIG. 4(d), the entire surface of the structured body including the inner walls of the holes is coated with catalyst particles to promote the reducing reaction. For example, when nonelectrolytic copper plating is to be performed, as the catalyst, a solution containing a Pd—Sn colloidal catalyst is used. Subsequently, as shown in FIG. 4(e), the sacrifice layers 41a1 and 41c1 are peeled off. The peeling-off of the sacrifice layers produces a state in which the catalyst particles for promoting the nonelectrolytic plating are formed only on the inner walls of the holes. Then, nonelectrolytic plating is performed. By the nonelectrolytic plating, metals 44 are attached only on the inner walls of the through holes. Thus, an anisotropic electroconductive sheet 40 of the present invention can be obtained as shown in FIG. 4(f). The plating can give electrical conductivity to the hole portions simultaneously. Consequently, it has excellent productivity, reduces the cost, and enables mass production.

As in Embodiment 1, an anisotropic electroconductive sheet of the present invention can be produced by performing nonelectrolytic plating without forming catalyst particles. However, the method of Embodiment 2 is advantageous in that only the inner walls of the holes, which are the regions intended to be plated, can be effectively plated. Subsequently, as with Embodiment 1, coatings may be formed as required.

The anisotropic electroconductive sheet 40 has a base film 41, which is a porous PTFE sheet having electrically insulating property. The sheet is provided with a plurality of holes 43 formed in the direction of thickness so that pin electrodes can be through-hole-mounted. The inner walls of the holes 43 are coated with metals 44. The sheet can be electrically continuous with the inserted pin electrodes through the metals 44. In other words, the sheet is an anisotropic electroconductive sheet having electrical conductivity in the direction of thickness.

Embodiment 3

In this embodiment, holes are formed to some midpoint of the base film by drilling without forming through holes. FIG. 5 shows an outline of the production method. First, as shown in FIG. 5(a), sacrifice layers 51a and 51c, each of which has a thickness of 100 µm and is made of PTFE, are formed on the two main surfaces of a base film 51b, which has a thickness of 2 mm and is made of PTFE.

Next, as shown in FIG. 5(b), holes are formed in the direction of thickness such that the tip of a drill 58a just reaches the sacrifice layer 51c. Subsequently, as shown in FIG. 5(c), partial machining is performed using a larger-diameter drill 58b to form a tapered structure at the opening portion of the hole.

Next, as shown in FIG. 5(d), the entire surface of the structured body including the inner walls of the holes is coated with catalyst particles to promote the reducing reaction. Subsequently, as shown in FIG. 5(e), the sacrifice layers 51a1 and 51c1 are peeled off. The peeling-off of the sacrifice layers produces a state in which the catalyst particles for promoting the nonelectrolytic plating are formed only on the inner walls of the holes. Then, when the nonelectrolytic plating is performed, metals 54 are attached only on the inner walls of the holes. Thus, an anisotropic electroconductive sheet 50 of the present invention can be obtained as shown in FIG. 5(f). The plating can give electrical conductivity to the hole portions simultaneously. Consequently, it has excellent productivity and enables mass production.

The anisotropic electroconductive sheet 50 has a base film 51, which is a porous PTFE sheet having electrically insulating property. The sheet is provided with a plurality of holes 53 formed in the direction of thickness so that pin electrodes can be through-hole-mounted. The inner walls of the holes 53 are coated with metals 54. The sheet can be electrically continuous with the inserted pin electrodes through the metals 54. In other words, the sheet is an anisotropic electroconductive sheet having electrical conductivity in the direction of thickness.

Embodiment 4

According to the present invention, yet another method of producing an anisotropic electroconductive sheet has a feature in that the method uses an expanded porous PTFE sheet as the porous film and heat-fuses a nonporous PTFE sheet, which is a nonporous film, to the expanded porous PTFE sheet. The method used an expanded porous PTFE sheet having a thickness of 0.7 mm and a nonporous PTFE sheet having a thickness of 0.3 mm. The heat fusion was performed by heating them at 350° C. and 100 g/cm$^2$ for 2 hours. By using a method similar to that used in Embodiment 2, holes were formed in the sheet with a drill and nonelectrolytic plating was performed at the porous-film portion at the surface of the inner walls of the holes to produce an anisotropic electroconductive sheet.

Embodiment 5

According to the present invention, yet another method of producing an anisotropic electroconductive sheet has a feature in that the method uses an expanded porous PTFE sheet as the porous film and forms a nonporous film by applying a polymerizable monomer on the sheet and then by curing it. The method used an expanded porous PTFE sheet having a thickness of 0.7 mm. The polymerizable monomer was prepared by adding 40 weight parts of epicure 134A (acid anhydride, made by Japan Epoxy Resins Co., Lid.) to 100 weight parts of epicoat 828 (a bisphenol A-type epoxy resin, made by Japan Epoxy Resins Co., Lid.). The polymerizable monomer was applied with a thickness of 0.3 mm to the sheet. The applied monomer was cured at 80° C. for 4 hours to form a nonporous film. By using a method similar to that used in Embodiment 2, holes were formed in the sheet with a drill and nonelectrolytic plating was performed at the porous-film portion at the surface of the inner walls of the holes to produce an anisotropic electroconductive sheet.

It is to be considered that the above-disclosed embodiments and examples are illustrative and not restrictive in all respects. The scope of the present invention is shown by the scope of the appended claims, not by the above-described explanation. Accordingly, the present invention is intended to cover all revisions and modifications included within the meaning and scope equivalent to the scope of the claims.

INDUSTRIAL APPLICABILITY

An anisotropic electroconductive sheet of the present invention can connect with through-hole-mounted pin electrodes flexibly and reliably. Therefore, the sheet is particularly useful when used for the inspection of a semiconductor package.

The invention claimed is:

1. An anisotropic electroconductive sheet, having electrical conductivity in a direction of thickness;
   the sheet comprising a base film formed by using a porous film that is made of synthetic resin and that has an electrically insulating property;
   the porous film being provided with a plurality of holes that are formed in the direction of thickness so that pin electrodes can be through-hole-mounted;
   the holes having inner walls coated with metals;
   the though-hole-mounted pin electrodes become electrically continuous, through the metals, with the surface opposite to the surface from which the pin electrodes are to be inserted, wherein
   the porous film has a non-porous film that is made of synthetic resin and that has an electrically insulating property at a side from which the pin electrodes are to be though-hole-mounted;
   the non-porous film is provided with a plurality of holes that are formed in the direction of thickness so that the pin electrodes can be through-hole-mounted;
   the non-porous film has a surface roughness of at most 10 µm in arithmetic-mean roughness; and
   the thickness of the non-porous film is at least 10% and at most 60% of a total thickness of the porous film having the non-porous film.

2. An anisotropic electroconductive sheet as defined by claim 1, wherein the nonporous film is a polytetrafluoroethylene film.

3. An anisotropic electroconductive sheet as defined by claim 1, wherein the nonporous film is obtained by applying a polymerizable monomer onto the porous film and then by curing the monomer.

4. An anisotropic electroconductive sheet as defined by claim 1, wherein the holes are through holes.

5. An anisotropic electroconductive sheet as defined by claim 1, wherein the opening portion of the holes from which the pin electrodes are inserted has a tapered structure.

6. An anisotropic electroconductive sheet as defined by claim 1, wherein the porous film is an expanded polytetrafluoroethylene film.

* * * * *